United States Patent

Matsui

[11] Patent Number: 5,815,453
[45] Date of Patent: Sep. 29, 1998

[54] SEMICONDUCTOR MEMORY DEVICE HAVING REDUNDANT DECODER WITH SUBTANTIALLY CONSTANT MARGIN REGARDLESS OF POWER VOLTAGE LEVEL

[75] Inventor: Yoshinori Matsui, Tokyo, Japan

[73] Assignee: NEC Corporation, Tokyo, Japan

[21] Appl. No.: 908,709

[22] Filed: Aug. 8, 1997

[30] Foreign Application Priority Data

Aug. 9, 1996 [JP] Japan ................................ 8-227777

[51] Int. Cl.$^6$ ........................................................ G11C 7/02
[52] U.S. Cl. ........................................ 365/210; 365/189.09
[58] Field of Search ................................ 365/189.01, 210, 365/218, 200, 189.09

[56] References Cited

U.S. PATENT DOCUMENTS 5,699,306  12/1997  Lee et al. .................................. 365/210

*Primary Examiner*—David C. Nelms
*Assistant Examiner*—Thong Le
*Attorney, Agent, or Firm*—Foley & Lardner

[57] ABSTRACT

A redundant decoder has a charge line, a plurality of fuse elements connected to the charge line and selectively broken for storing a first address assigned to a defective column group of memory cells and a plurality of switching transistors connected between the fuse elements and a ground line and gated with internal address signals representative of a second address assigned to a column group of memory cells to be accessed, and compares the first address with the second address to see whether or not the defective column group is accessed; when the defective column group is accessed, all of the switching transistors are turned off, and an output circuit generates internal control signals on the basis of the potential level on the charge line so as to replace the defective column group with a redundant column group; when a non-defective column group is accessed, at least one current path is provided from the charge line through the non-broken fuse element and the switching transistor to the ground line, and the output circuit does not produce the internal control signal; and a current mirror circuit is connected between the charge line and the output circuit so as to prevent the output circuit from the resistance of the series of the non-broken fuse element and the associated switching transistor.

8 Claims, 7 Drawing Sheets

SEMICONDUCTOR MEMORY DEVICE HAVING REDUNDANT DECODER WITH SUBTANTIALLY CONSTANT MARGIN REGARDLESS OF POWER VOLTAGE LEVEL

FIELD OF THE INVENTION

This invention relates to a semiconductor memory device and, more particularly, to a semiconductor memory device having a redundant decoder with a constant margin regardless of a power voltage level.

DESCRIPTION OF THE RELATED ART

A dynamic random access memory device is incorporated in a computer system as a main memory and/or a graphic memory, and proceeds in synchronism with a system clock in order to accelerate a data access. The system clock is supplied from the outside to the semiconductor dynamic random access memory device, and clock signals are internally produced from the system clock. The system clocks are distributed to component units at appropriate timings, and controls the data access sequence.

FIG. 1 illustrates a typical example of the semiconductor dynamic random access memory device. The prior art semiconductor dynamic random access memory device is integrated on a single semiconductor chip 100, and comprises a 16 mega-bit memory cell array 101, 4096 word lines WL0 to WL4095 selectively connected to the memory cells and bit line groups (not shown) also selectively connected to the memory cells. The word lines WL0 to WL4095 have respective row addresses, and are selectively changed to active level. The memory cells coupled to the selected word line are electrically connected to the bit line groups, and data bits are propagated through the bit line groups.

The prior art semiconductor dynamic random access memory device further comprises an address buffer 102 connected to address pins A0 to A11, a row address decoder 103 connected to the address buffer 102, a column address generator 104 also connected to the address buffer 102, a column address decoder 105 connected to the column address generator 104 and a sense amplifier 106 connected between the bit line groups and a latch circuit 107. The column address decoder 105 has 512 column selecting lines CSL0 to CSL511, and column addresses are assigned to the column selecting lines CSL0 to CSL511, respectively. Accessed memory cells are selected by using the word lines WL0 to WL4095 and the column selecting lines CSL0 to CSL511, and eight memory cells are concurrently selected from the 16 mega-bit memory cell array 101.

The address buffer 102 supplies internal row address signals corresponding to the address bits A0 to A11 to the row address decoder 103, and the internal row address signals represent one of the row addresses. The row address decoder 103 decodes the internal row address signals in order to determine the row address, and changes the word line assigned the row address to the active level. Then, data bits are read out from the memory cells connected to the selected word line to the bit line groups, and are transferred through the bit line groups to the sense amplifier 106.

The address buffer 102 further supplies internal address bits corresponding to the address bits A0 to A8 to the column address generator 104, and the column address generator 104 produces the internal column address signals Y0 to Y8 representative of a column address. The column address decoder 105 decodes the internal column address signals, and changes the column selecting line assigned the column address to active level. Then, eight data bits are supplied from the sense amplifier 106 to the latch circuit 107 or vice versa.

The prior art semiconductor dynamic random access memory device further comprises an output data buffer 108 connected to data pins D0 to DV, an input data buffer 109 also connected to the data pins D0 to DV and an input/output switching circuit 110 connected between the latch circuit 107 and the output/input data buffers 108/109. The input/output switching circuit 110 is responsive to an internal read/write control signal (not shown), and selectively connects the latch circuit 107 to the output data buffer 108 or the input data buffer 109. When the input/output switching circuit 110 selects the output buffer 108, the data bits are transferred from the latch circuit 107 to the output data buffer 108, and the output data buffer 108 produces an eight-bit output data signal Sout from the data bits. On the other hand, when the input/output switching circuit 110 connects the input data buffer 109 to the latch circuit 107, the input data buffer 109 produces input data bits from an eight-bit input data signal Sin, and the input data bits are transferred from the input data buffer 109 through the input/output switching circuit 110 to the latch circuit 107.

The prior art semiconductor dynamic random access memory device further comprises an internal oscillator 1 11 connected to a clock pin CLK and a clock generator 112 connected to control signal pins CSB, RASB, CASB and WEB. A system clock is supplied through the clock pin CLK to the internal oscillator 111, and a row address strobe signal RASB, a column address strobe signal CASB, a write enable signal WEB and a chip select signal CSB are supplied through the control signal pins CSB, RASB, CASB and WEB to the clock generator 112. The internal oscillator 111 produces an internal clock signal ICLK in synchronism with the system clock signal, and distributes the internal clock signal ICLK to the address buffer 102 and the clock generator 112.

The address buffer 102 and the clock generator 112 respectively latch the address bits A0 to A11 and the row address strobe signal/column address strobe signal/write enable signal/chip select signal at the rise of the internal clock signal ICLK. The clock generator 112 produces internal timing control signals such as LOAD1, LOAD2 and PRE. The internal timing control signals LOAD1/LOAD2 are supplied to the column address generator 104, and the column address generator 104 is responsive to each of the internal timing control signals LOAD1/LOAD2 so as to produce the internal column address signals Y0 to Y8 from the address bits A0 to A8. The internal timing control signal PRE is described hereinlater.

The prior art semiconductor dynamic random access memory device further comprises a redundant decoder 113 for replacing a defective column group of memory cells with a redundant column group of memory cells. The memory cell array 101 contains a plurality of column groups of memory cells regularly used for storing data bits and an additional column group of memory cells. If a defective column group of memory cells is found through a diagnosis carried out after the fabrication of the prior art semiconductor dynamic random access memory device, the defective column group of memory cells is replaced with the redundant column group of memory cells, and the prior art semiconductor memory device can provide the memory cell array 101 as a data storage guaranteed in the design specification.

The redundant decoder 113 stores the column address of the defective column group of memory cells, and compares the internal column address signals Y0 to Y8 to seen whether or not the address bits A0 to A8 represents the column address assigned to the defective column group of memory cells in response to the internal timing control signal PRE. When the column address assigned to the defective column group is matched with the column address stored in the redundant decoder 113, the redundant decoder 113 supplies a disable signal RED to the column address decoder 105 so as not to respond to the internal column address signals Y0 to Y8, and causes the sense amplifier 106 to transfer the data bit read out from the redundant column group to the latch circuit.

FIG. 2 illustrates the circuit configuration of the redundant decoder 113. The redundant decoder 113 includes nine pairs of fuse elements FSP0 to FSP8 connected in parallel to a charge line 113a, nine pairs of switching transistors SWP0 to SWP8 connected between the nine pairs of fuse elements FSP0 to FSP8 and a ground line and nine inverters IV0 to IV8. Each of the pair of fuse elements FSP0 to FSP8 consists of a first fuse element FSa and a second fuse element FSb, and each pair of switching transistors SWP0 to SWP8 consists of a first n-channel enhancement type switching transistor SWa and a second n-channel enhancement type switching transistor SWb.

The eight pairs of fuse elements FSP0 to FSP8 are respectively assigned to nine address bits of the column address assigned to the defective column group of memory cells. If one of the address bits is logic "1" level, the second fuse element FSb is broken through radiation of a laser beam. On the other hand, if the address bit is logic "0" level, the first fuse element FSa is broken. In this way, the row address assigned to the defective column group is stored in the redundant decoder 113.

The internal column address signals Y0 to Y8 are supplied to the inverters IV0 to IV8, respectively, and the inverters IV0 to IV8 produces complementary internal column address signals. The first n-channel enhancement type switching transistors SWa are connected to the first fuse elements FSa, respectively, and the complementary internal column address signals are respectively supplied to the gate electrodes of the first n-channel enhancement type switching transistors SWa, respectively. On the other hand, the second n-channel enhancement type switching transistors SWb are respectively connected to the second fuse elements FSb, and the internal column address signals Y0 to Y8 are respectively supplied to the gate electrodes of the second e-channel enhancement type switching transistors SWb. Thus, each internal column address signal Y0 to Y8 causes either first or second n-channel enhancement type switching transistor SWa/SWb of the associated pair to turn on.

The redundant decoder 113 further includes a p-channel enhancement type precharging transistor 113b connected between a positive power supply line Vdd and the charge line 113a, an n-channel enhancement type discharging transistor 113c connected between the charge line 113a and the ground line, an inverter 113d connected at an input node thereof to the charge line 113a and a latch circuit 113e connected to the inverter 113d for producing the disable signal RED and the selecting signal RCSL. The p-channel enhancement type charge transistor 113b is responsive to the internal timing control signal PRE of the low level, and charges the charge line 113a to the positive power voltage level Vdd. On the other hand, the n-channel enhancement type discharge transistor 113c is responsive to the internal timing control signal PRE of the high level, and discharges the precharging line 113a.

The column address of the defective column group is assumed to be represented by the internal column address signals Y0 to Y8 of [000000000]. The first fuse elements FSa were broken. When the internal column address signals Y0 to Y8 are supplied to the redundant decoder 113, the internal column address signals Y0 to Y8 maintain the second n-channel enhancement type switching transistors SWb in off state. Even though the complementary internal column address signals cause the first n-channel enhancement type switching transistors SWa to turn on, the first fuse elements FSa have been broken, and no current path takes place between the charge line 113a to the ground line. However, if the internal column address signals Y0 to Y8 represents a column address different from that of the defective column group, at least one internal column address signal Y0 to Y8 is logic "1" level, and the internal column address signal of logic "1" level causes the second n-channel enhancement type switching transistor SWb to turn on, and the charge line 113a is discharged through the second n-channel enhancement type switching transistor SWb.

The potential level on the charge line 113a is transferred through the inverter 113d to the latch circuit 113e, and the latch circuit 113e changes the disable signal RED and the selecting signal RCSL between the inactive level and the active level depending upon the potential level at the output node of the inverter 113d in response to the internal timing control signal PRE.

FIG. 3 illustrates a sequential access to the memory cell array 101. The column address AD0 and the next column address AD1 are assumed to be assigned to a non-replaced column group of memory cells and the redundant column group of memory cells replaced with the defective column group. The row address decoder 103 has changed one of the word lines WL0 to WL4095 to the active level, and the sense amplifier 106 completes the magnification of the potential levels on the bit line groups.

The internal clock signal ICLK rises at time t1, and the address buffer 102 latches the external column address bits representative of the column address AD0 in response to the internal clock signal ICLK. The internal clock signal ICLK is further supplied to the clock generator 112 and the clock generator 112 starts to sequentially produce the internal timing control signals.

The clock generator 112 produces the internal timing clock signal LOAD1 at time t2, and the column address generator 104 is responsive to the internal timing control signal LOAD1 so as to produce the internal column address signals Y0 to Y8.

The clock generator changes the internal timing control signal PRE from the high level to the low level at time t3. While the clock generator 112 was keeping the internal timing control signal PRE in the high level, the n-channel A enhancement type discharge transistor 113c was turned on, and the charge line 113a has been in the ground level. The internal timing clock signal PRE of the low level causes the n-channel enhancement type discharge transistor 113c to turn off and the p-channel enhancement type charge transistor 113b to turn on. The charge line 113a is charged toward the positive power voltage level Vdd, and the internal column address signals Y0 to Y8 and the complementary signals thereof are supplied to the pairs of n-channel enhancement type switching transistors SWP0 to SWP8. As described hereinbefore, the column address AD0 is representative of the non-replaced column group of memory cells, and at least one non-broken fuse element FSa/FSb is connected through the associated n-channel enhancement type switching transistor SWa/SWb to the ground line. The charge line 113a and, accordingly, the input node of the inverter 113d are maintained at an intermediate level lower than the threshold of the inverter 113d. The output node of the inverter 113d is in the high level, and the high level is stored in the latch circuit 113e in the presence of the internal timing control signal PRE of the low level. The latch circuit 113e maintains the disable signal RED and the selecting signal RCSL in the inactive low level.

For this reason, the column address decoder 105 decodes the internal column address signals Y0 to Y8, and changes one of the selecting lines CSL0 to CSL511 to the active high level. Then, the data bits are transferred from the sense amplifier 106 to the latch circuit 107. The data bit read out from the redundant memory cell is never transferred to the latch circuit 107, because the selecting signal RCSL is maintained at the inactive low level.

The clock generator 112 changes the internal timing control signal PRE to the high level at time t4, and the n-channel enhancement type discharge transistor 113c turns on so as to discharge the charge line 113a and the input node of the inverter 113d.

The internal clock signal ICLK is changed to the high level at time t5 again. The address buffer 102 latches the column address bits A0 to A8 representative of the column address AD1.

The internal clock signal ICLK is further supplied to the clock generator 112 and the clock generator 112 starts to sequentially produce the internal timing control signals.

The clock generator 112 produces the internal timing clock signal LOAD2 at time t6, and the column address generator 104 is responsive to the internal timing control signal LOAD2 so as to produce the internal column address signals Y0 to Y8 representative of the column address AD1.

The clock generator 112 changes the internal timing control signal PRE from the high level to the low level at time t7. The n-channel enhancement type discharge transistor 113c was turned on between time t4 and time t7, and the charge line 113a has been in the ground level. The internal timing clock signal PRE of the low level causes the n-channel enhancement type discharge transistor 113c to turn off and the p-channel enhancement type charge transistor 113b to turn on. The charge line 113a is charged toward the positive power voltage level Vdd, and the internal column address signals Y0 to Y8 and the complementary signals thereof are supplied to the pairs of n-channel enhancement type switching transistors SWP0 to SWP8. As described hereinbefore, the column address AD1 is representative of the defective column group of memory cells, and all of the broken fuse elements FSa/FSb are blocked from the ground line by means of the associated n-channel enhancement type switching transistor SWa/SWb. For this reason, the charge line 113a and, accordingly, the input node of the inverter 113d are charged to the positive power voltage level Vdd.

The output node of the inverter 113d is changed to the low level at time t8, and the low level is stored in the latch circuit 113e in the presence of the internal timing control signal PRE of the low level. The latch circuit 113e changes the disable signal RED and the selecting signal RCSL to the high level.

For this reason, the column address decoder 105 is disabled, and never responds the internal column address signals Y0 to Y8. All of the selecting lines CSL0 to CSL511 are maintained at the inactive low level. The selecting line RCSL of the active high level causes the data bit read out from the redundant me memory cell to be transferred from the sense amplifier 106 to the latch circuit 107.

The clock generator 112 changes the internal timing control signal PRE to the high level at time t10, and the n-channel enhancement type discharge transistor 113c turns on so as to discharge the charge line 113a and the input node of the inverter 113d.

The fuse elements FSa/FSb are formed of tungsten silicide, and are selectively broken through a laser trimming. The laser trimming sets a limit on the pattern of the fuse element FSa/FSb. For this reason, the fuse elements FSa/FSb for the 16 mega-bit semiconductor dynamic random access memory device are regulated to about 500 ohms.

When the positive power voltage Vdd is increased, the prior art semiconductor dynamic random access memory device encounters a problem in the margin between the charge line 113a and the threshold of the inverter 113d. In detail, only one of the internal column address signals Y0 is assumed to be different from the address bits of the defective column group stored in the redundant decoder 113. The charge line 113a is connected through the non-broken fuse element FSa/FSb and the associated n-channel enhancement type switching transistor SWa/SWb to the ground line, and the p-channel enhancement type charge transistor 113b lifts the charge line 113a to a certain level not higher than the threshold of the inverter 113d. The on-resistance of the p-channel enhancement type charge transistor 113b, the on-resistance of the n-channel enhancement type switching transistor SWa/SWb and the resistance of the non-broken fuse element FSa/FSb determines the certain potential level of the charge line 113a and the input node of the inverter 113d. If the positive power voltage line Vdd, the p-channel enhancement type charge transistor 113b and the n-channel enhancement type switching transistor SWa/SWb respectively provide the positive power voltage level Vdd of 3.3 volts, the on-resistance of 2 kilo-ohms and the on-resistance of 500 ohms, the input node of the inverter 113d is equal to 0.33 Vdd. If the inverter 113d has the threshold of 0.5 Vdd, the margin is 0.17 Vdd.

However, when the power voltage level Vdd is increased to 4.0 volts, the on-resistance of the p-channel enhancement type charge transistor 113b and the on-resistance of the n-channel enhancement type switching transistor SWa/SWb are given by using the equation for drain current ID=$\beta/2 \times$ (VGS−Vth)$^2$ where Vth is the threshold of−0.7 volt for the p-channel enhancement type charge transistor 113b or the threshold of 0.5 volt for the n-channel enhancement type switching transistor SWa/SWb on the assumption that those transistors 113b and SWa/SWb are operating in the saturated region. The on-resistance is calculated to be 1.23 kilo-ohms for the p-channel enhancement type charge transistor 113b and 0.32 kilo-ohm for the n-channel enhancement type switching transistor SWa/SWb. The fuse element FSa/FSb provides 500 ohms, and the charge line 113a and the input node of the inverter 113d are increased to 0.40 Vdd. As will be understood, when the positive power potential level Vdd is decreased from 3.3 volts to 4.0 volts, the margin is decreased at more than 20 percent. The drain current ID is exponentially increased together with the positive power voltage level Vdd without change of the resistance of the fuse element FSa/FSb, and the potential level at the charge line 113a is getting closer and closer to the threshold of the inverter 113d. Thus, the margin between the charge line 113a and the threshold of the inverter 113d is decreased, and hazard noise is liable to take place at the output node of the inverter 113d.

When the fuse element FSa/FSb is formed by using the tungsten silicide strip, the resistance is unavoidably varied at 20 percent. If the resistance is changed at 20 percent, the fuse element FSa/FSb provides the resistance of 600 ohms. In this situation, when the positive power voltage Vdd is changed to 4.0 volts, the charge line 113a is balanced at 0.43 Vdd, and the margin is further decreased.

SUMMARY OF THE INVENTION

It is therefore an important object of the present invention to provide a semiconductor memory device, a redundant decoder of which has a large margin regardless of a power voltage level.

In accordance with one aspect of the present invention, there is provided a semiconductor memory device comprising: a memory cell array having at least one redundant memory cell group and a plurality of memory cell groups each replaceable with the at least one redundant memory cell group; a data interface for communicating with an external device; an addressing means responsive to address signals representative of a first address for selectively connecting the plurality of memory cell groups and the redundant memory cell group to the data interface; and a redundant decoder including a memory circuit for storing a second address assigned to one of the plurality of memory cell groups replaced with the at least one redundant memory cell group, a comparator comparing the second address with the first address to see whether or not the address signals indicate the first address assigned to the one of the plurality of memory cell groups replaced with the at least one redundant memory cell group, the comparator providing a predetermined level to an output node thereof when the second address is matched with the first address, a charging circuit connected to a power potential line, a discharging circuit connected to a constant potential line, a current mirror circuit connected between the charging circuit and the discharging circuit and having a control node connected to the output node of the comparator for changing a potential level at an output node thereof, and a control signal generating circuit responsive to the potential level at the output node of the current mirror circuit so as to produce control signals supplied to the addressing means, the control signals causing the addressing means to connect the redundant memory cell group instead of the one of the plurality of memory cell groups to the data interface.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 1:
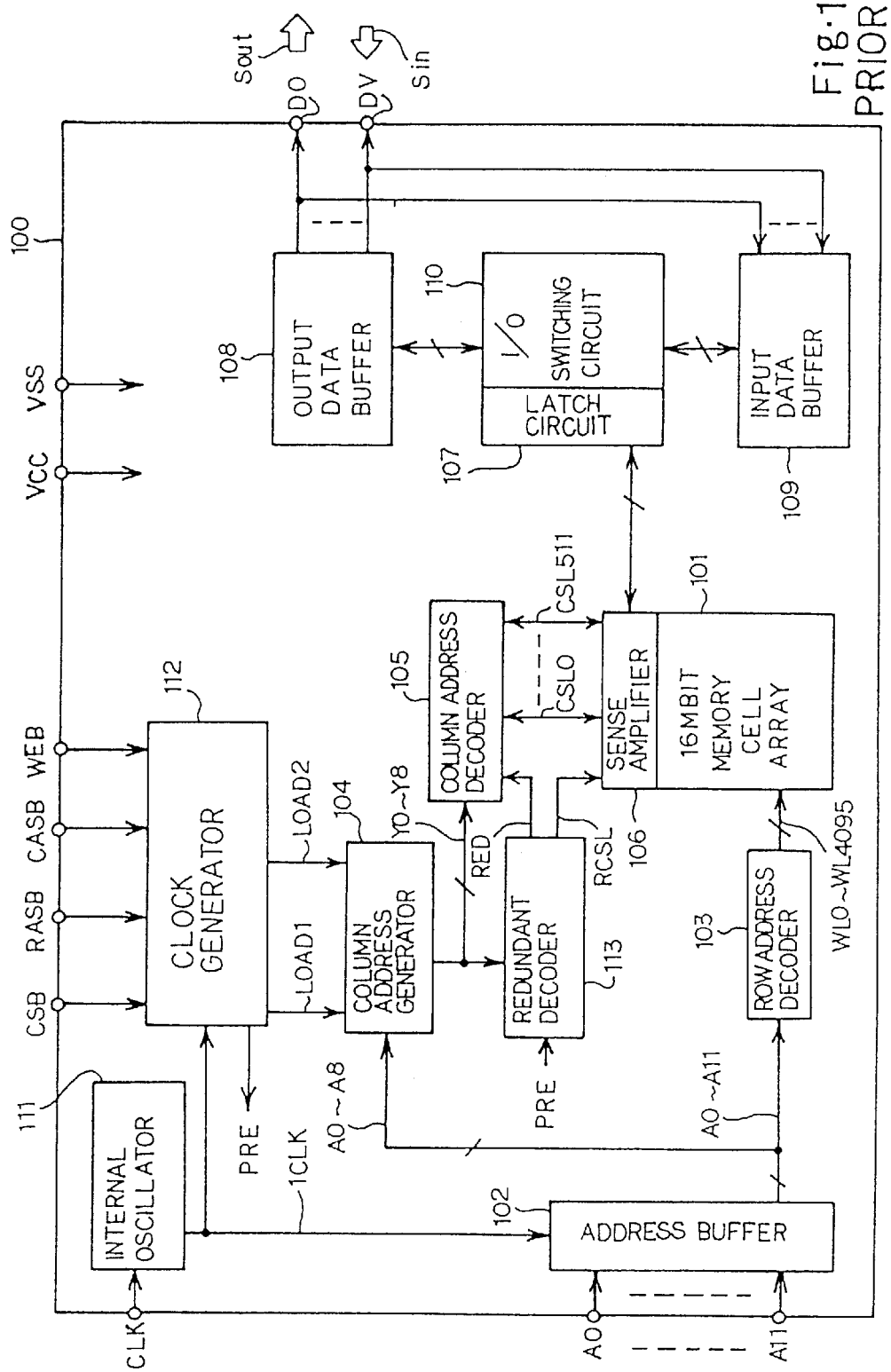
FIG. 1 is a block diagram showing the arrangement of the prior art semiconductor dynamic random access memory device.
Figure 2:
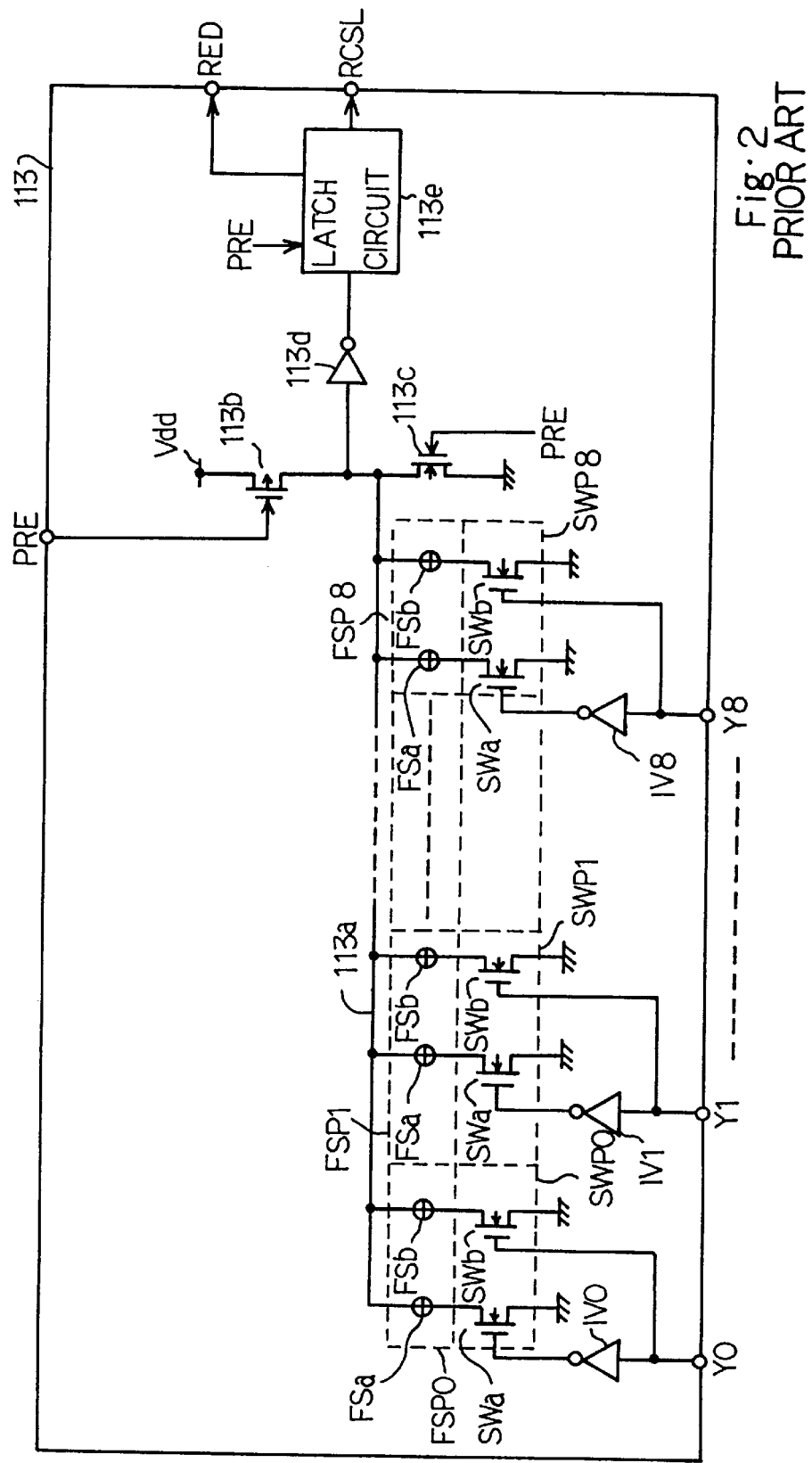
FIG. 2 is a circuit diagram showing the circuit configuration of the redundant decoder incorporated in the prior art semiconductor dynamic random access memory device.
Figure 3:
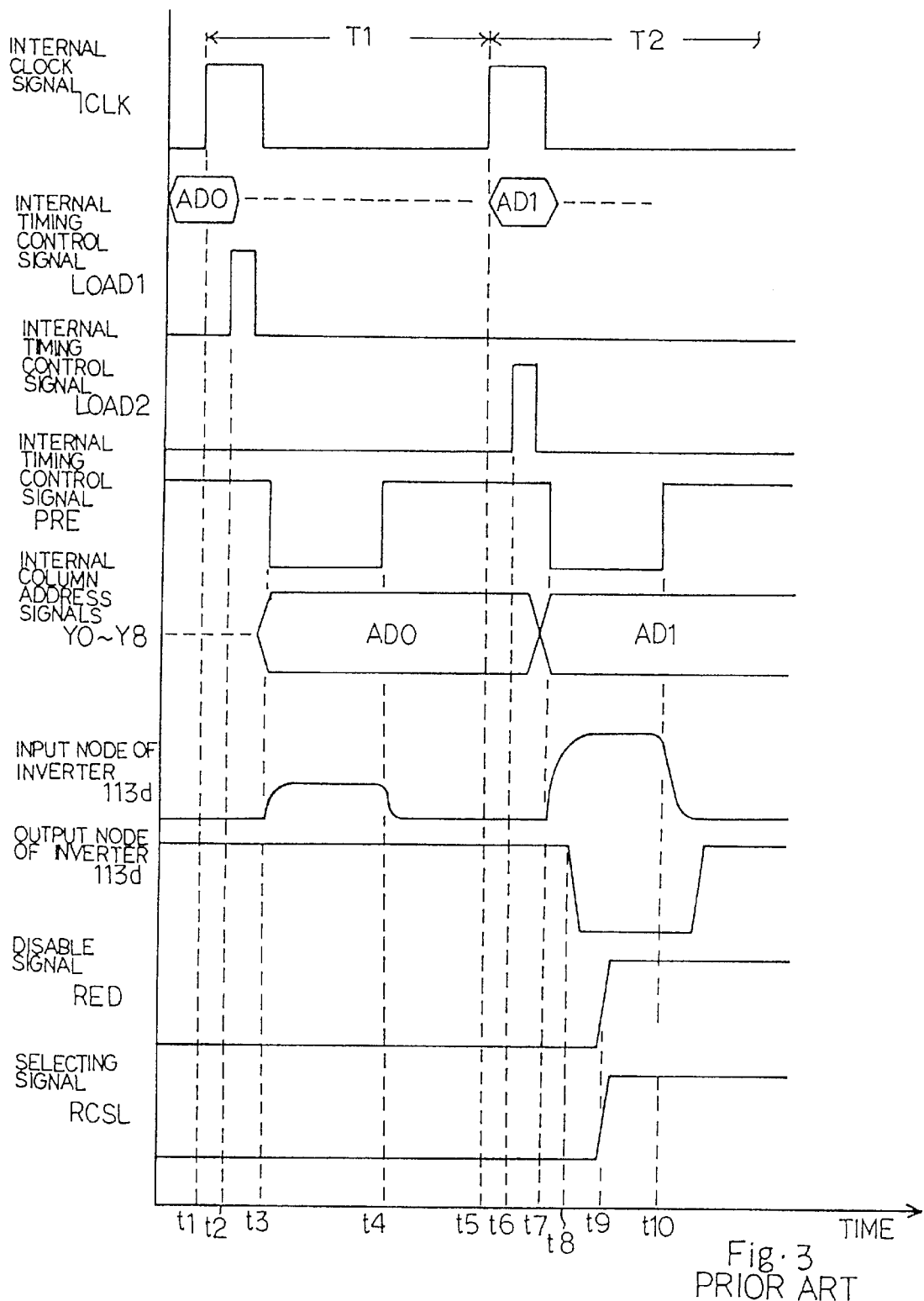
FIG. 3 is a timing chart showing the sequential access to the non-replaced column group and the redundant column group.
Figure 4:
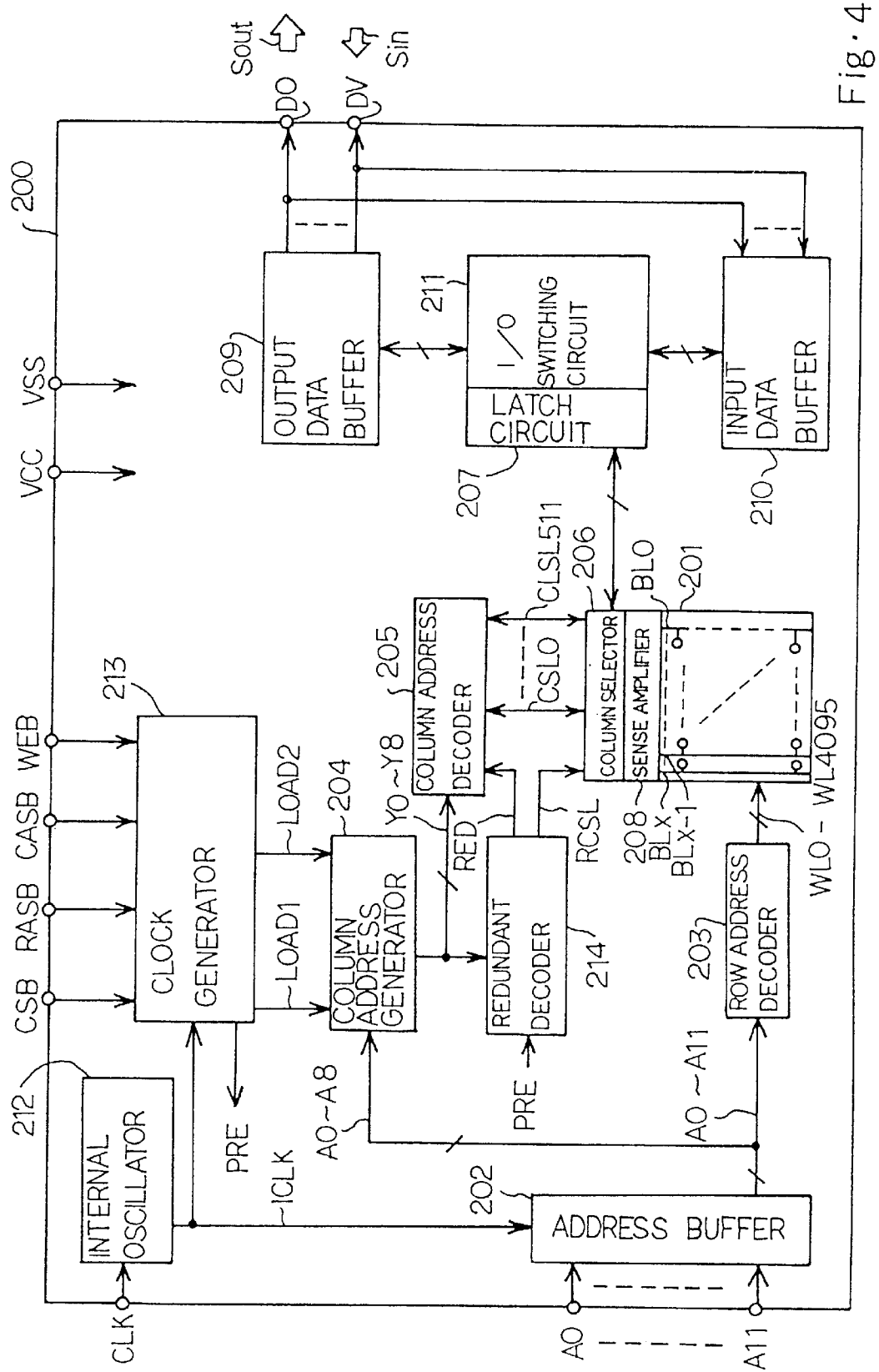
FIG. 4 is a block diagram showing the arrangement of a semiconductor dynamic random access memory device according to the present invention.

Referring to FIG. 4 of the drawings, a semiconductor dynamic random access memory device is integrated on a single semiconductor chip 200, and comprises a 16 mega-bit memory cell array 201, 4096 word lines WL0 to WL4095 selectively connected to the memory cells of the array 201 and bit line groups BL0 to BLx also selectively connected to the memory cells. The word lines WL0 to WL4095 have respective row addresses, and are selectively changed to active level. The bit line groups BL0 to BLx are connected to the columns of memory cells, and the columns of memory cells are divided into regular column groups of memory cells and at least one redundant column group of memory cells. The bit line groups connected to the regular columns of memory cells have respective column addresses, and propagate potential differences representative of data bits read out from or written into the memory cells connected to the selected word line. When one of the regular column groups of memory cells is found to be defective, the defective column group of memory cells is replaced with the redundant column group of memory cells, and data bits are written into and read out from the redundant column group of memory cells instead of the defective column of memory cells. In this instance, the bit line group BLx is assumed to be connected to the redundant column group of memory cells. The memory cells are represented by small circles in FIG. 4.

The semiconductor dynamic random access memory device further comprises an address buffer 202 connected to address pins A0 to A11, a row address decoder 203 connected to the address buffer 202, a column address generator 204 also connected to the address buffer 202, a column address decoder 205 connected to the column address generator 204, a column selector 206 connected between the bit lines BL0 to BLx and a latch circuit 207 and a sense amplifier 208 connected to the bit line groups BL0 to BLx. The column address decoder 205 has 512 column selecting lines CSL0 to CSL511, and allows the column selector 206 to connect one of the bit line groups BL0 to BLx–1 to the latch circuit 207. The word lines WL0 to WL4095 and the column selecting lines CSL0 to CSL511 concurrently select eight memory cells from the 16 mega-bit memory cell array 201, and, accordingly, each column group of memory cells is constituted by eight columns of memory cells. The address pins A0 to A11 are shared between external row address bits and external column address bits, and the row address bits and the column address bits are supplied to the address pins A0 to A11 at different timing.

When the address buffer 202 receives the external row address bits, the address buffer 202 supplies internal row address signals corresponding to the address bits A0 to A11 to the row address decoder 203. The internal row address signals represent one of the row addresses. The row address decoder 203 decodes the internal row address signals in order to determine the row address assigned to the accessed memory cells, and changes one of the word lines WL0 to WL4095 assigned the row address to the active level. Then, data bits are read out from the memory cells connected to the selected word line to the bit line groups BL0 to BLx, and are transferred through the bit line groups BL0 to BLx to the sense amplifier 208. The sense amplifier 208 increases the magnitude of the potential differences on the bit line groups BL0 to BLx.

The address buffer 202 further supplies internal address bits corresponding to the external column address bits A0 to A8 to the column address generator 204, and the column address generator 204 produces the internal column address signals Y0 to Y8 representative of one of the column addresses. The column address decoder 205 decodes the internal column address signals Y0 to Y9, and changes the column selecting line assigned the column address to active level. Then, eight data bits are supplied from the sense amplifier 206 to the latch circuit 207 or vice versa.

The semiconductor dynamic random access memory device further comprises an output data buffer 209 connected to data pins D0 to DV, an input data buffer 210 also connected to the data pins D0 to DV and an input/output switching circuit 211 connected between the latch circuit 207 and the output/input data buffers 209/210. The input/output switching circuit 211 is responsive to an internal read/write control signal (not shown), and selectively connects the latch circuit 207 to the output data buffer 208 or the input data buffer 209.

When the input/output switching circuit 211 selects the output buffer 209, the data bits are transferred from the latch circuit 207 to the output data buffer 209, and the output data buffer 209 produces an eight-bit output data signal Sout from the read-out data bits.

On the other hand, when the input/output switching circuit 211 connects the input data buffer 210 to the latch circuit 207, the input data buffer 210 produces write-in data bits from an eight-bit input data signal Sin, and the write-in data bits are transferred from the input data buffer 210 through the input/output switching circuit 211 to the latch circuit 207.

The semiconductor dynamic random access memory device further comprises an internal oscillator 212 connected to a clock pin CLK and a clock generator 213 connected to control signal pins CSB, RASB, CASB and WEB. A system clock is supplied through the clock pin CLK to the internal oscillator 212, and a row address strobe signal RASB, a column address strobe signal CASB, a write enable signal WEB and a chip select signal CSB are supplied through the control signal pins CSB, RASB, CASB and WEB to the clock generator 213. The internal oscillator 212 produces an internal clock signal ICLK in synchronism with the system clock signal, and distributes the internal clock signal ICLK to the address buffer 202 and the clock generator 213.

The address buffer 202 and the clock generator 213 respectively latch the external row/column address bits A0–A11/A0–A8 and the row address strobe signal/column address strobe signal/write enable signal/chip select signal at the rise of the internal clock signal ICLK. The clock generator 213 produces internal timing control signals such as LOAD1, LOAD2 and PRE. The internal timing control signals LOAD1/LOAD2 are supplied to the column address generator 204, and the column address generator 204 is responsive to each of the internal timing control signals LOAD 1/LOAD2 so as to produce the internal column address signals Y0 to Y8 from the address bits A0 to A8. The internal timing control signal PRE is described hereinlater.

The semiconductor dynamic random access memory device further comprises a redundant decoder 214 for replacing a defective column group of memory cells to the redundant column group of memory cells. The redundant decoder 214 stores the address of the defective column group of memory cells, and compares the internal column address signals Y0 to Y8 with the column address stored therein to seen whether or not the address bits A0 to A8 represents the column address assigned to the defective column group of memory cells in response to the internal timing control signal PRE. When the column address assigned to the defective column group is matched with the column address stored in the redundant decoder 214, the redundant decoder 214 supplies a disable signal RED to the column address decoder 205 so as not to respond to the internal column address signals Y0 to Y8, and causes the column selector 206 to transfer the data bit read out from the redundant column group to the latch circuit 207 by using a selecting signal RCSL.

Figure 5:
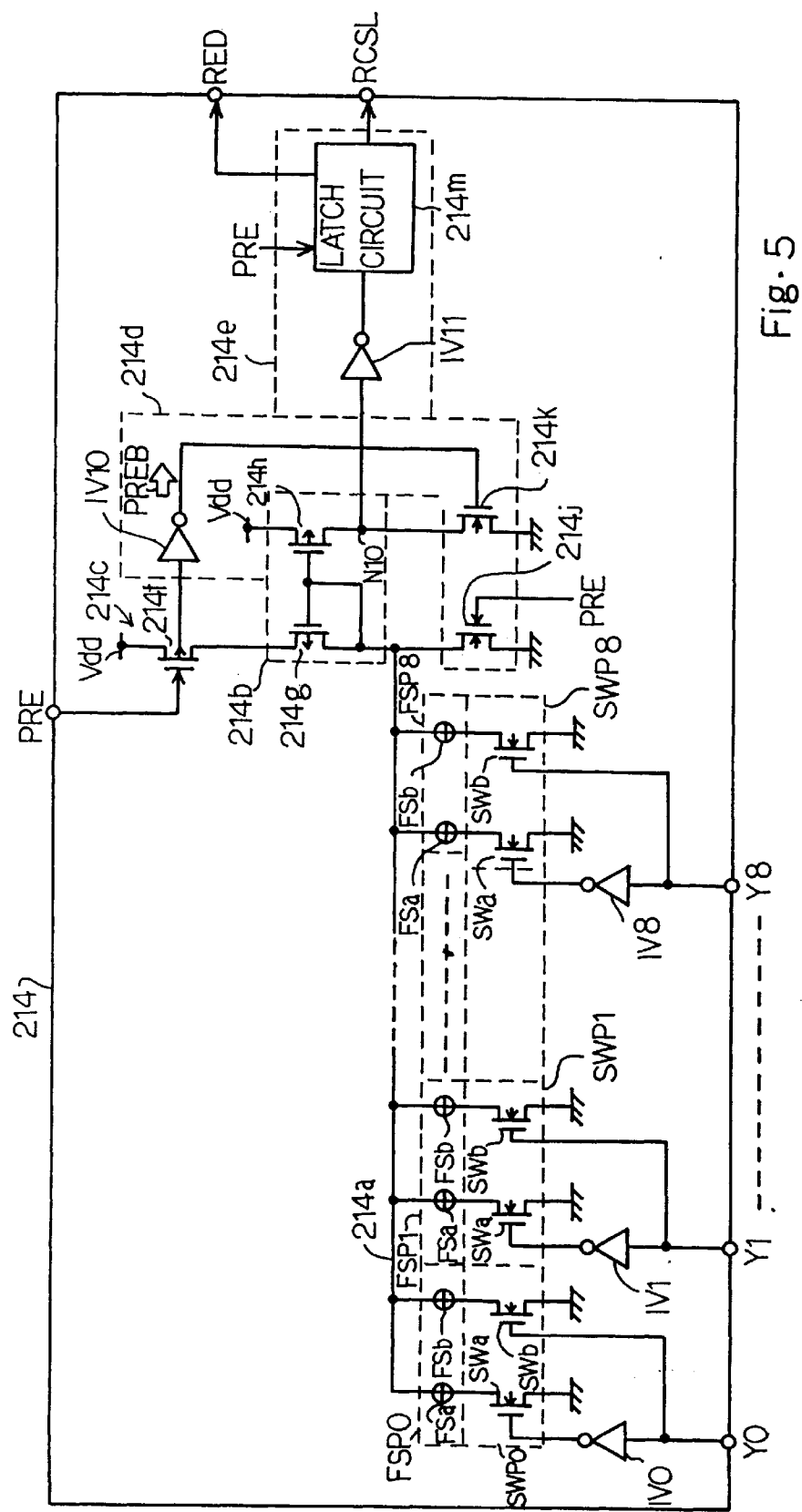
FIG. 5 is a circuit diagram showing the circuit configuration of a redundant decoder incorporated in the semiconductor dynamic random access memory device.

FIG. 5 illustrates the circuit configuration of the redundant decoder 214. The redundant decoder 214 includes nine pairs of fuse elements FSP0 to FSP8 connected in parallel to a charge line 214a, nine pairs of switching transistors SWP0 to SWP8 connected between the nine pairs of fuse elements FSP0 to FSP8 and a ground line and nine inverters IV0 to IV8. Each of the pair of fuse elements FSP0 to FSP8 consists of a first fuse element FSa and a second fuse element FSb, and each pair of switching transistors SWP0 to SWP8 consists of a first n-channel enhancement type switching transistor SWa and a second n-channel enhancement type switching transistor SWb. The fuse elements FSa/FSb are formed of tungsten silicide, and each fuse element FSa/FSb is designed to provide the resistance of 500 ohms. In this instance, the channel width of the n-channel enhancement type switching transistor SWa/SWb is determined in such a manner that the resistance of the fuse element FSa/FSb is equal to or less than 10 percent of the on-resistance of the n-channel enhancement type switching transistor SWa/SWb. For this reason, the fuse element FSa/FSb is less affective to the margin of the redundant decoder 214.

The eight pairs of fuse elements FSP0 to FSP8 are respectively assigned to nine address bits of the column address assigned to the defective column group of memory cells. If one of the address bits is logic "1" level, the second fuse element FSb is, broken through radiation of a laser beam. On the other hand, if the address bit is logic "0" level, the first fuse element FSa is broken. In this way, the row address assigned to the defective column is stored in the redundant decoder 214.

The internal column address signals Y0 to Y8 are supplied to the inverters IV0 to IV8, respectively, and the inverters IV0 to IV8 produces complementary internal column address signals. The first n-channel enhancement type switching transistors SWa are connected to the first fuse elements FSa, respectively, and the complementary internal column address signals are respectively supplied to the gate electrodes of the first n-channel enhancement type switching transistors SWa. On the other hand, the second n-channel enhancement type switching transistors SWb are respectively connected to the second fuse elements FSb, and the internal column address signals Y0 to Y8 are respectively supplied to the gate electrodes of the second n-channel enhancement type switching transistors SWb. Thus, each internal column address signal Y0 to Y8 causes either first or second n-channel enhancement type switching transistor SWa/SWb of the associated pair to turn on. In this instance, the pairs of fuse elements FSP0 to FSP8 form in combination a memory circuit, and the pairs of n-channel enhancement type switching transistors SWa/SWb and the inverters IV0 to IV8 as a whole constitute a comparator.

The redundant decoder 214 further includes a current mirror circuit 214b, a charging circuit 214c, a discharging circuit 214d and a control signal generating circuit 214e.

The charging circuit 214c is implemented by a p-channel enhancement type charging transistor 214f, and a positive power voltage line Vdd is connected to the source node of the p-channel enhancement type charging transistor 214f. The internal timing control signal PRE is supplied to the gate electrode of the p-channel enhancement type charging transistor 214f, and causes the p-channel enhancement type charging transistor 214f to supply a positive power voltage level Vdd to the current mirror circuit 214b.

The current mirror circuit 214b is implemented by a parallel combination of p-channel enhancement type field effect transistors 214g/214h. The p-channel enhancement type field effect transistor 214g is connected between the p-channel enhancement type charging transistor 214f and the charge line 214a, and the other p-channel enhancement type field effect transistor 214h is connected between the positive power voltage line Vdd and an output node N10 of the current mirror circuit 214b. Both gate electrodes of the p-channel enhancement type field effect transistors 214g/214h are connected to the charge line 214a, and the p-channel enhancement type field effect transistors 214g/214h concurrently vary the channel conductance depending upon the potential level on the charge line 214a. Thus, the potential level on the charge line 214a is transferred through the current mirror circuit 214a to the control signal generating circuit 214e.

The discharging circuit 214d includes a parallel combination of n-channel enhancement type discharging transistors 214j/214k connected between the p-channel enhancement type field effect transistors 214g/214h and a ground line and an inverter IV10 for producing a complementary timing control signal PREB. The n-channel enhancement type discharging transistor 214j is gated with the internal timing control signal PRE, and the other n-channel enhancement type discharging transistor 214k is gated with the complementary internal timing control signal PREB. The potential level on the charge line 214a is converted through the current mirror circuit 214b to the amount of current passing through the output node N10, and the p-channel enhancement type field effect transistor 214h and the n-channel enhancement type discharging transistor 214k convert the amount of current to the potential level at the output node N10. The potential level at the output node N10 is varied in the CMOS range.

The control signal generating circuit 214e includes an inverter IV11 and a latch circuit 214m. The inverter IV11 has an input node connected to the output node N10 of the current mirror circuit 214a, and the latch circuit is responsive to the internal timing control signal PRE for producing the disable signal RED and the selecting signal RCSL. The disable signal RED is supplied to the column address decoder 205, and does not allow the column address decoder 205 to drive the selecting lines CSL0 to CSL511. The selecting signal RCSL is supplied to the column selector 206, and causes the column selector 206 to provide a signal path between the bit line BLx and the latch circuit 207.

Figure 6:
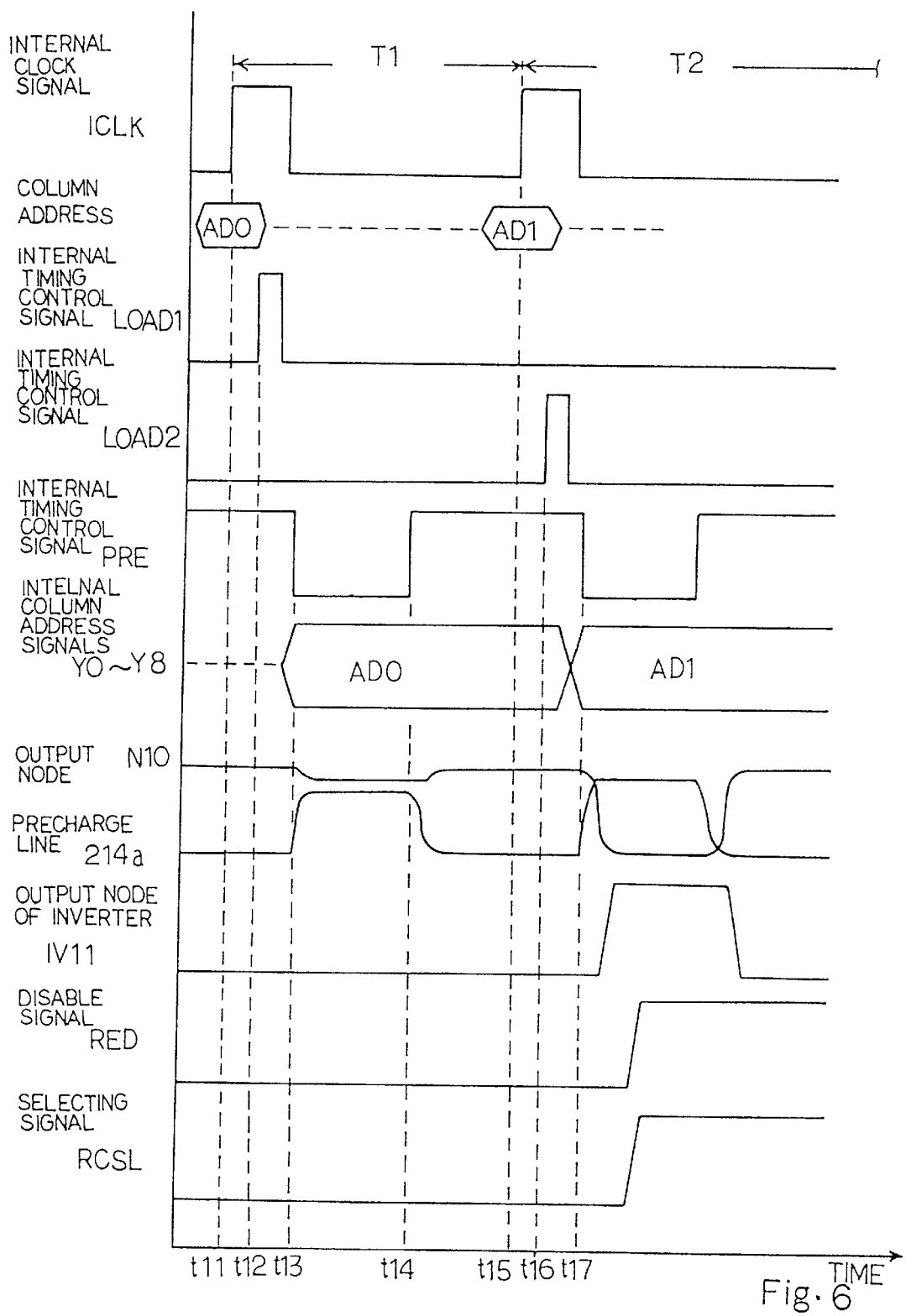
FIG. 6 is a timing chart showing a sequential access to a non-replaced regular column group and a redundant column group.

FIG. 6 illustrates a sequential access to the memory cell array 201. The row address decoder had changed one of the word lines WL0 to WL4095. The data bits were read out from the memory cells associated with the selected word line to the bit lines groups BL0 to BLx, and the sense amplifier 208 have already amplified the read-out data bits.

In the following description, a regular column group of memory cells was replaced with the redundant column group of memory cells. Column address AD1 is assigned to the regular column group of memory cells replaced with the redundant column group, and have been already stored in the pairs of fuse elements FSP0 to FSP8. Column address AD0 is assigned to a non-defective regular column group of memory cells.

The internal oscillator 212 raises the internal clock signal ICLK at time t11, and the address buffer 202 latches the column address AD0. The internal clock signal ICLK is further supplied to the clock generator 213, and the clock generator 213 changes the internal timing control signal LOAD1 to the high level at time t12. Then, the column address generator 204 produces the internal column address signals Y0 to Y8 from the column address bits, and the internal column address signals Y0 to Y8 are supplied to the column address decoder 205 and the redundant decoder 214.

The clock generator 213 changes the internal timing control signal PRE to the low level at time t13, and the inverter IV10 produces the complementary internal timing control signal PREB from the internal timing control signal PRE. In this situation, the p-channel enhancement type charging transistor 214f, the n-channel enhancement type discharging transistor 214j and the n-channel enhancement type discharging transistor 214k are in the on state, the off state and the on state, respectively. Current flows through the p-channel enhancement type charging transistor 214f and the p-channel enhancement type field effect transistor 214g to the charge line 214a, and the charge line 214a is charged to a certain level close to the positive power voltage level Vdd. Current also flows through the p-channel enhancement type field effect transistor 214h and the n-channel enhancement type discharging transistor 214k, and the potential level at the output node N10 is slightly decayed. The column address AD0 is inconsistent with the column address stored in the redundant decoder 214, and at least one current path takes place through the fuse element FSa/FSb and the associated n-channel enhancement type switching transistor SWa/SWb. The discharging current is transferred through the p-channel enhancement type field effect transistor 214g to current passing through the p-channel enhancement type field effect transistor 214h. The current is converted to the potential level at the output node N10, and the potential level is determined by the ratio of current driving capability between the p-channel enhancement type field effect transistor 214h and the n-channel enhancement type discharging transistor 214k. However, the potential level at the output node N10 does not exceed the threshold of the inverter IV11, and the inverter IV11 keeps the output node thereof in the low level. The low level is stored in the latch circuit 214m in response to the internal timing control signal PRE, and the latch circuit 214m keeps the disable signal RED and the selecting signal RCSL low.

The internal timing control signal PRE is recovered to the high level at time t14, and the p-channel enhancement type charging transistor 214f, the n-channel enhancement type discharging transistor 214j and the n-channel enhancement type discharging transistor 214k are changed to the off state, the on state and the off state, respectively. The charge line 214a is discharged, and the output node N10 is charged to the positive power voltage level Vdd.

The internal clock signal ICLK rises at time t15, and the column address AD1 is stored in the address buffer 202. The clock generator 213 changes the internal timing control signal LOAD2 to the high level at time t16, and the column address generator 204 changes the internal column address signals Y0 to Y8 from AD0 to AD1.

The clock generator 213 changes the internal timing control signal PRE to the low level at time t17, and the charge line 214a is charged through the p-channel enhancement type charging transistor 214f and the p-channel enhancement type field effect transistor 214g.

The internal column address signals Y0 to Y8 are supplied to the redundant decoder 214, and the column AD1 address of the internal column address signals Y0 to Y8 is compared with the column address of the defective column group of memory cells. The column address AD1 is consistent with the column address stored in the redundant decoder 214, and no current path is provided between the charge line 214a and the ground line. Then, the p-channel enhancement type field effect transistors 214g/214h turn off, and the output node N10 is decayed to the ground level. The inverter IV11 changes the output node thereof to the high level, and the high level is latched by the latch circuit 214m in response to the internal timing control signal PRE.

The latch circuit 214m supplies the disable signal RED of the active high level and the selecting signal RCSL of the active high level to the column address decoder 205 and the column selector 206, respectively. The column address decoder 205 is disabled, and no selecting line CSL0 to CSL511 is changed to the active level. The selecting line RCSL causes the column selector 206 to connect the bit line group BLx to the latch circuit 207, and the data bit is supplied through the latch circuit 207 and the input/output switching circuit 211 to the output data buffer 209.

In the following description, only the internal column address bit Y0 is assumed to be opposite in logic level to the address bit stored in the pair of fuse element FSP0. The fuse element FSb of the pair FSP0 and the n-channel enhancement type switching transistor SWb of the pair SWP0 provide a current path from the charge line 214a to the ground line.

As described hereinbefore, the discharging current is transferred through the p-channel enhancement type field effect transistor 214g to the current passing through the p-channel enhancement type field effect transistor 214h, and the p-channel enhancement type field effect transistor 214h and the n-channel enhancement type discharging transistor 214k vary the potential level at the output node N10 within the CMOS range.

When only one column address signal is opposite in logic level to the address bit, the potential level at the output node N10 becomes closer to the threshold of the inverter IV11. In detail, the associated n-channel enhancement type switching transistor SWa/SWb discharges the least current, and the potential drop on the charge line 214a is extremely small, and the on-resistance of the p-channel enhancement type field effect transistor 214h is much smaller than the on-resistance of the n-channel enhancement type discharging transistor 214k. This results in the potential level at the output node N10 close to the threshold of the inverter IV11.

The channel width of the n-channel enhancement type switching transistor SWa/SWb is assumed to be determined in such a manner that the on-resistance is equal to 7.8 kilo-ohms under the positive power voltage level of 3.3 volts. The resistance of the fuse element FSa/FSb is 500 ohms, and is 6.4 percents of the on-resistance.

The channel dimensions of the n-channel enhancement type discharging transistor 214k is determined in such a manner that the potential level at the output node N10 is 0.66 Vdd on the assumption that unit current of "1" flows through the p-channel enhancement type field effect transistor 214h.

When the positive power voltage Vdd is increased to 4.0 volts, the p-channel enhancement type field effect transistor 214h allows the current to flow 1.5 times larger than the unit current. The p-channel enhancement type transistor and the n-channel enhancement type transistor have the threshold of −1.7 volts and the threshold of 0.5 volt, respectively, and both transistors are assumed to operate in the saturated region. The drain current ID is given by the equation of $ID = \beta/2 \times (VGS-Vth)^2$, and the on-resistance of the n-channel enhancement type switching transistor SWa/SWb is of the order of 5 kilo-ohms. For this reason, the current is 1.5 times increased.

The resistance of the fuse element FSa/FSb is 500 ohms, and is 10 percent of the on-resistance of the n-channel enhancement type switching transistor SWa/SWb. The on-resistance of the n-channel enhancement type discharging transistor 214k is decreased to 64 percent, and the potential level at the output node N10 is 0.634 Vcc, i.e., 0.66 Vcc×0.64×1.5. Thus, even if the positive power voltage Vdd is changed from 3.3 volts to 4.0 volts, the margin is decreased at less than 5 percent.

Even if the fuse element FSa/FSb is increased in resistance at 20 percent, the fuse element FSa/FSb provides the resistance of 600 ohms. The potential level at the output node N10 is 0.62 Vdd under the positive power voltage of 4.0 volts. The margin is merely decreased by 1 percent.

As will be appreciated from the foregoing description, the redundant decoder according to the present invention is less sensitive to the positive power voltage level Vdd, and stably produces the disable signal RED and the selecting signal RCSL.

Second Embodiment

Figure 7:
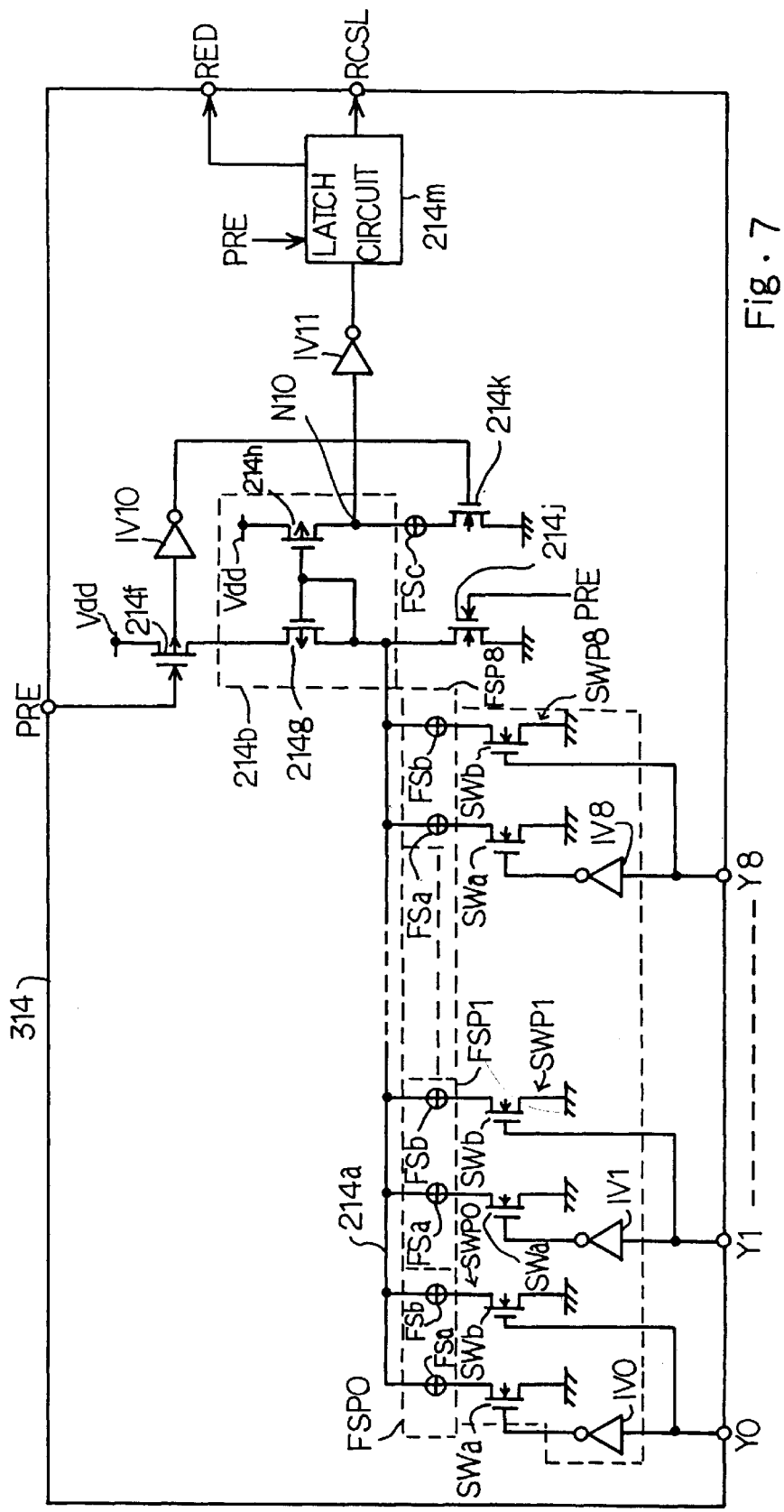
FIG. 7 is a circuit diagram showing the circuit configuration of another redundant decoder incorporated in another semiconductor memory device according to the present invention.

FIG. 7 illustrates a redundant decoder 314 incorporated in another semiconductor memory device embodying the present invention. The other components are similar to those of the first embodiment, and description is focused on the redundant decoder 314 only.

The redundant decoder 314 is similar in circuit arrangement to the redundant decoder 214 except for a fuse element FSc. For this reason, the other circuit components are labeled with the references designating the corresponding components of the redundant decoder 214. The fuse element FSc is inserted between the output node N10 and the n-channel enhancement type discharging transistor 214k. The fuse element FSc is formed of tungsten silicide, and provides resistance as large as that of the fuse element FSa/FSb. For this reason, the voltage dependency on the fuse element is equalized between the n-channel enhancement type switching transistor SWa/SWb and the n-channel enhancement type discharging transistor 214k, and the margin is never decreased.

Although particular embodiments of the present invention have been shown and described, it will be obvious to those skilled in the art that various changes and modifications may be made without departing from the spirit and scope of the present invention.

For example, the redundant decoder may be incorporated in any kind of semiconductor memory device such as, for example, a semiconductor static random access memory device, an electrically erasable and programmable read only memory device and an electrically programmable read only memory device.

The redundant decoder may store a row address of a defective row of memory cells so as to replace the defective row with a redundant row.

The redundant decoder may store more than one address of defective memory cell groups so as to replace the defective memory cell groups with redundant memory cell groups, respectively.

What is claimed is:

1. A semiconductor memory device comprising:
    a memory cell array having at least one redundant memory cell group and a plurality of memory cell groups each replaceable with said at least one redundant memory cell group;
    a data interface for communicating with an external device;
    an addressing means responsive to address signals representative of a first address for selectively connecting said plurality of memory cell groups and said redundant memory cell group to said data interface; and
    redundant decoder including
        a memory circuit for storing a second address assigned to one of said plurality of memory cell groups replaced with said at least one redundant memory cell group,
        a comparator comparing said second address with said first address to see whether or not said address signals indicate the first address assigned to said one of said plurality of memory cell groups replaced with said at least one redundant memory cell group, said comparator providing a predetermined level to an output node thereof when said second address is matched with said first address,
        a charging circuit connected to a power potential line,
        a discharging circuit connected to a constant potential line,
        a current mirror circuit connected between said charging circuit and said discharging circuit and having a control node connected to said output node of said comparator for changing a potential level at an output node of said current mirror circuit, and
        a control signal generating circuit responsive to said potential level at said output node of said current mirror circuit so as to produce control signals supplied to said addressing means, said control signals causing said addressing means to connect said redundant memory cell group instead of said one of said plurality of memory cell groups to said data interface.

2. The semiconductor memory device as set forth in claim 1, in which said memory circuit has a plurality of pairs of first fuse elements connected in parallel to said output node of said comparator and assigned to address bits representative of said second address, and said first fuse elements of each pair are selectively broken depending upon the logic level of associated one of said address bits.

3. The semiconductor memory device as set forth in claim 2, further comprising a second fuse element connected between said output node of said current mirror circuit and said discharging circuit, and said second fuse element provides resistance approximately equal to resistance of the first fuse element.

4. The semiconductor memory device as set forth in claim 1, in which said memory circuit has a plurality of pairs of fuse elements connected in parallel to said output node of said comparator and assigned to address bits representative of said second address, a fuse elements of each pair being selectively broken depending upon the logic level of associated one of said address bits, and said comparator has a plurality of switching transistors connected between said fuse elements of said plurality of pairs and a constant potential line and a plurality of logic circuits for producing complementary address signals from said address signals representative of said first address, said plurality of switching transistors being gated by said address signals and said complementary address signals.

5. The semiconductor memory device as set forth in claim 3, in which the resistance of each of said fuse elements is equal to or less than 10 percent of an on-resistance of associated one of said plurality of switching transistors.

6. The semiconductor memory device as set forth in claim 1, in which said current mirror circuit includes a first transistor connected between said charging circuit and said output node of said comparator and having a first gate electrode connected to said control node, a second transistor connected between said power potential line and said output node of said current mirror circuit and having a second gate electrode connected to said control node, and said discharging circuit includes a first discharging transistor connected between said first transistor and said constant potential line and gated by an internal timing control signal and a second discharging transistor connected between said second transistor and said constant potential line and gated by a complementary signal of said internal timing control signal.

7. The semiconductor memory device as set forth in claim 6, in which said charging circuit is responsive to said internal timing control signal so as to connect said power potential line to said first transistor in a first phase before the comparison of said first address with said second address, and said internal timing control signal and said complementary signal respectively change said first discharging transistor and said second discharging transistor to the off state and the on state in said first phase so as to charge said output node of said comparator to said predetermined level.

8. The semiconductor memory device as set forth in claim 7, in which said internal timing control signal change the charging circuit and said first discharging transistor to the off state and the on state in a second phase after the production of said control signals, and said complementary signal changes said second discharging transistor to the on state in said second phase.

* * * * *